United States Patent
Choi et al.

(10) Patent No.: US 6,930,356 B2
(45) Date of Patent: Aug. 16, 2005

(54) POWER SEMICONDUCTOR DEVICE HAVING HIGH BREAKDOWN VOLTAGE, LOW ON-RESISTANCE, AND SMALL SWITCHING LOSS AND METHOD OF FORMING THE SAME

(75) Inventors: Young-chul Choi, Kyungki-do (KR);
Tae-hoon Kim, Kyungki-do (KR);
Ho-cheol Jang, Kyungki-do (KR);
Chong-man Yun, Kyungki-do (KR)

(73) Assignee: Fairchild Korea Semiconductor Ltd. (KR)

( * ) Notice: Subject to any disclaimer, the term of this patent is extended or adjusted under 35 U.S.C. 154(b) by 0 days.

(21) Appl. No.: 10/464,059

(22) Filed: Jun. 17, 2003

(65) Prior Publication Data

US 2004/0041229 A1 Mar. 4, 2004

(30) Foreign Application Priority Data

Jun. 18, 2002 (KR) .............................. 10-2002-0034141

(51) Int. Cl.[7] ........................................... H01L 31/119
(52) U.S. Cl. ...................................... 257/341; 257/401
(58) Field of Search ................................ 257/287, 341, 257/401

(56) References Cited

U.S. PATENT DOCUMENTS 4,987,098 A * 1/1991 Nishiura et al. ............ 438/138
6,093,948 A * 7/2000 Zambrano et al. .......... 257/339

* cited by examiner

*Primary Examiner*—David Nelms
*Assistant Examiner*—Quoc Hoang
(74) *Attorney, Agent, or Firm*—Townsend and Townsend and Crew LLP

(57) ABSTRACT

In accordance with one embodiment of the present invention, a power semiconductor device includes a first drift region of a first conductivity type extending over a semiconductor substrate. The first drift region has a lower impurity concentration than the semiconductor substrate. A second drift region of the first conductivity type extends over the first drift region, and has a higher impurity concentration than the first drift region. A plurality of stripe-shaped body regions of a second conductivity type are formed in an upper portion of the second drift region. A third region of the first conductivity type is formed in an upper portion of each body region so as to form a channel region in each body region between the third region and the second drift region. A gate electrode laterally extends over but is insulated from: (i) the channel region in each body region, (ii) a surface area of the second drift region between adjacent stripes of body regions, and (iii) a surface portion of each source region.

16 Claims, 8 Drawing Sheets

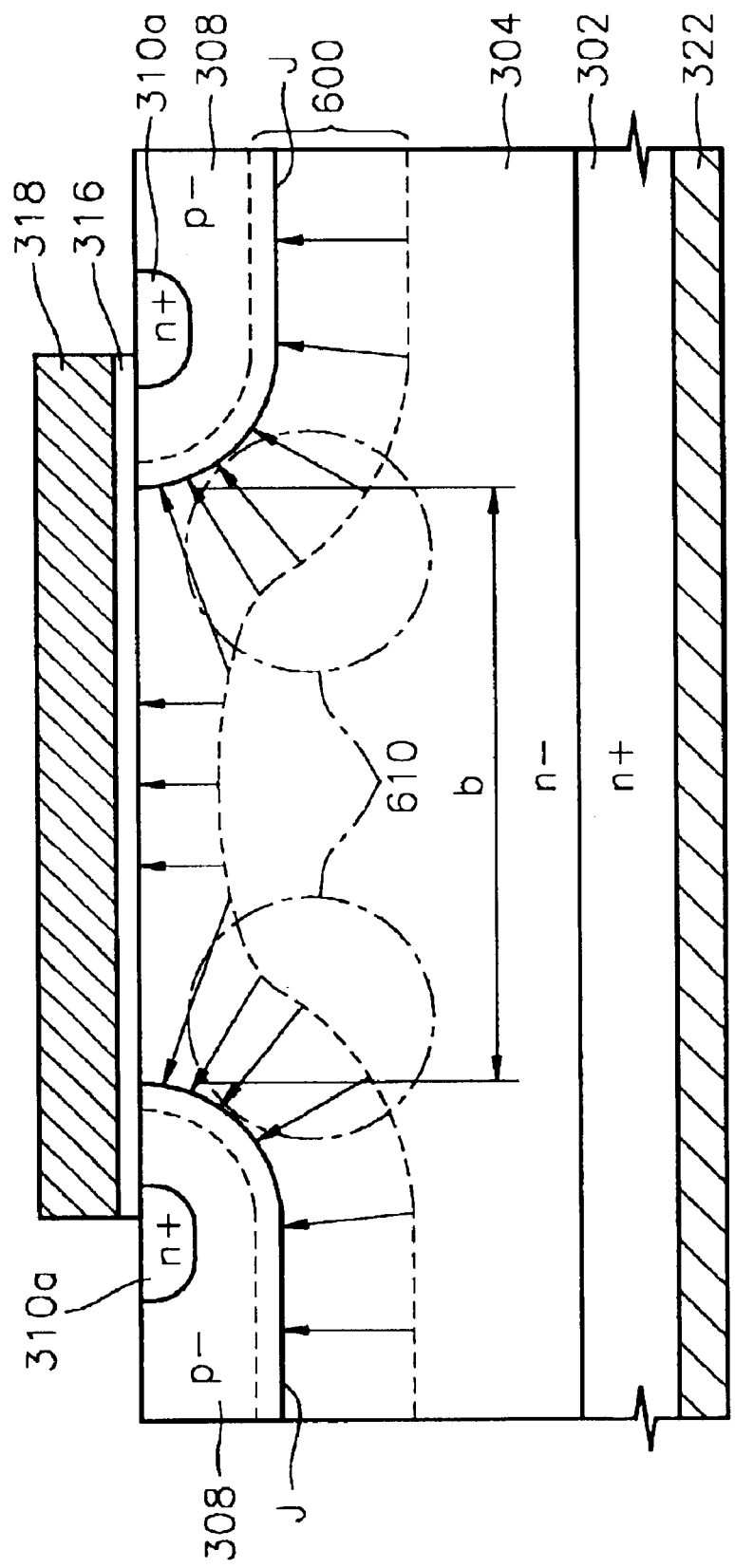

POWER SEMICONDUCTOR DEVICE HAVING HIGH BREAKDOWN VOLTAGE, LOW ON-RESISTANCE, AND SMALL SWITCHING LOSS AND METHOD OF FORMING THE SAME

CROSS-REFERENCES TO RELATED APPLICATIONS

This application claims priority from Korean Patent Application No. 2002-34141, filed on Jun. 18, 2002, in the Korean Intellectual Property Office, the disclosure of which is incorporated herein in its entirety by reference.

BACKGROUND OF THE INVENTION

The present invention relates in general to semiconductor technology, and more particularly to power semiconductor devices having high breakdown voltage, low onresistance, and small switching loss.

A power semiconductor device such as a power metal oxide semiconductor field effect transistor (MOSFET) is required to have high breakdown voltage, low on-resistance, and small switching loss. FIG. 1 is a layout view of a conventional power MOSFET, and FIG. 2 is a sectional view taken along line A–A' in FIG. 1. In FIGS. 1 and 2, like references are used to refer to like regions, layers, or portions throughout. In FIG. 1, a plurality of hexagonal unit cells 100 are spaced-apart from one another by a predetermined distance d so as to obtain an optimum breakdown voltage and on-resistance. The predetermined distance d between the hexagonal unit cells 100 is the same as a width d of a gate electrode 118. Each of hexagonal unit cells 100 has a source region 108 of $n^+$-type conductivity which is overlapped by gate electrode 118 and source electrode 120.

In FIG. 2, an $n^-$-type drift region 104 extends over an $n^+$-type drain region 102. Body regions 106 of $p^-$-type conductivity are formed in an upper portion of $n^-$-type drift region 104. Source regions 108 of $n^+$-type conductivity are formed in an upper portion of $p^-$-type body regions 106. Highly-doped regions 110 of $p^+$-type conductivity are formed in $p^-$-type body regions 106, and extend from a surface area of body regions 106 between source regions 108 to a depth terminating in drift region 104. Highly-doped region 112 of $n^+$-type conductivity is formed in an upper potion of $n^-$-type drift region 104 between $p^-$-type body regions 106. Highly doped ($n^+$) region 112 is deeper than source regions 108 but shallower than highly-doped ($p^+$) regions 110. Gate insulating layers 116 extend over channel regions 114 and highly-doped ($n^+$) regions 112, and overlap source regions 108. Gate electrode 118 extends over gate insulating layers 116. Source electrode 120 contacts source regions 108 and highly-doped ($p^+$) regions 110. A drain electrode 122 contacts $n^+$-type drain region 102.

In the hexagonal unit cell structure of FIGS. 1 and 2 reducing distance d between adjacent hexagonal unit cells 100 increases the channel density per unit area which reduces the device on-resistance. A further benefit of reducing distance d is that it leads to an improvement in the switching speed of the device. This is because reducing the distance d by reducing the spacing between adjacent body regions 106 results in a reduction in the total overlap area between gate electrodes 118 and highly doped ($n^+$) regions 112. This in turn results in a reduction in the gate to drain capacitance (Cgd) and thus an improvement in the device switching speed. Furthermore, a lower Cgd results in lower switching power loss.

Reducing the distance d however has the draw back of increasing the on-resistance of the device. This is because reducing the spacing between adjacent body regions 106 increases the resistance in the JFET region (i.e., the region between base regions 106). Moreover, because of the relatively shallow depth of highly doped ($n^+$) regions 112, reducing the spacing between body regions 106 reduces the effectiveness of highly doped ($n^+$) regions 112 in minimizing the resistance in the JFET region.

In addition, because of the hexagonal shape of units cells 100, the depletion region formed across the reverse-biased junction between drift region 104 and body regions 106 has a spherical shape. This results in lower breakdown voltage. To improve the breakdown voltage, it is necessary to increase the resistivity and/or a thickness of drift region 104. However this would lead a higher on-resistance Thus, a power device structure and method of forming the same which has a low on-resistance, high breakdown voltage, fast switching speed, and low switching loss is desirable.

BRIEF SUMMARY OF THE INVENTION

In accordance with one embodiment of the present invention, a power semiconductor device includes a first drift region of a first conductivity type extending over a semiconductor substrate. The first drift region has a lower impurity concentration than the semiconductor substrate. A second drift region of the first conductivity type extends over the first drift region, and has a higher impurity concentration than the first drift region. A plurality of stripe-shaped body regions of a second conductivity type are formed in an upper portion of the second drift region. A third region of the first conductivity type is formed in an upper portion of each body region so as to form a channel region in each body region between the third region and the second drift region. A gate electrode laterally extends over but is insulated from: (i) the channel region in each body region, (ii) a surface area of the second drift region between adjacent stripes of body regions, and (iii) a surface portion of each source region.

In one embodiment, adjacent stripes of body regions are spaced apart from one another by a predetermined distance such that when a reverse bias is applied across the junction formed between each body region and the second drift region a resulting depletion region has a substantially flat boundary in the second drift region.

In another embodiment, a frame region surrounds the plurality of stripe-shaped body regions such that upper and lower portions of each body region are terminated in the frame region. The frame region has the same conductivity type as the body regions.

In another embodiment, the second drift region has a graded impurity concentration which reduces toward an interface between the first and second drift regions.

In another embodiment, the first conductivity type is n-type and the second conductivity type is p-type.

In another embodiment, the power semiconductor device is a MOSFET, the semiconductor substrate is of the first conductivity type and forms MOSFET's drain contact region, and the third region forms MOSFET's source region.

In another embodiment, the power semiconductor device is an IGBT, the semiconductor substrate is of the second conductivity type and forms IGBT's collector contact region, and the third region forms IGBT's emitter region.

In accordance with another embodiment of the present invention, a method of forming a power semiconductor device is as follows. A first drift region of a first conductivity type is formed over a semiconductor substrate. The first drift region has a lower impurity concentration than the semiconductor substrate. A second drift region of the first conductivity type is formed over the first drift region. The second drift region has a higher impurity concentration than the first drift region. A plurality of stripe-shaped body regions of a second conductivity type are formed in an upper portion of the second drift region. A third region of the first conductivity type in formed in an upper portion of each body region so as to form a channel region in each body region between the third region and the second drift region. A gate electrode is formed which laterally extends over but is insulated from: (i) the channel region in each body region, (ii) a surface area of the second drift region between adjacent stripes of body regions, and (iii) a surface portion of each source region.

In one embodiment, adjacent stripes of body regions are spaced apart from one another by a predetermined distance such that when a reverse bias is applied across the junction formed between each body region and the second drift region a resulting depletion region has a substantially flat boundary in the second drift region.

In another embodiment, a frame region surrounding the plurality of stripe-shaped body regions is formed such that upper and lower portions of each body region are terminated in the frame region. The frame region has the same conductivity type as the body regions.

BRIEF DESCRIPTION OF THE DRAWINGS

The above and other features and advantages of the present invention will become more apparent by describing exemplary embodiments thereof with reference to the attached drawings in which:

FIG. 6A is a sectional view of a power MOS field effect transistor where a distance between adjacent body regions is relatively large;

DETAILED DESCRIPTION OF THE INVENTION

Figure 3:
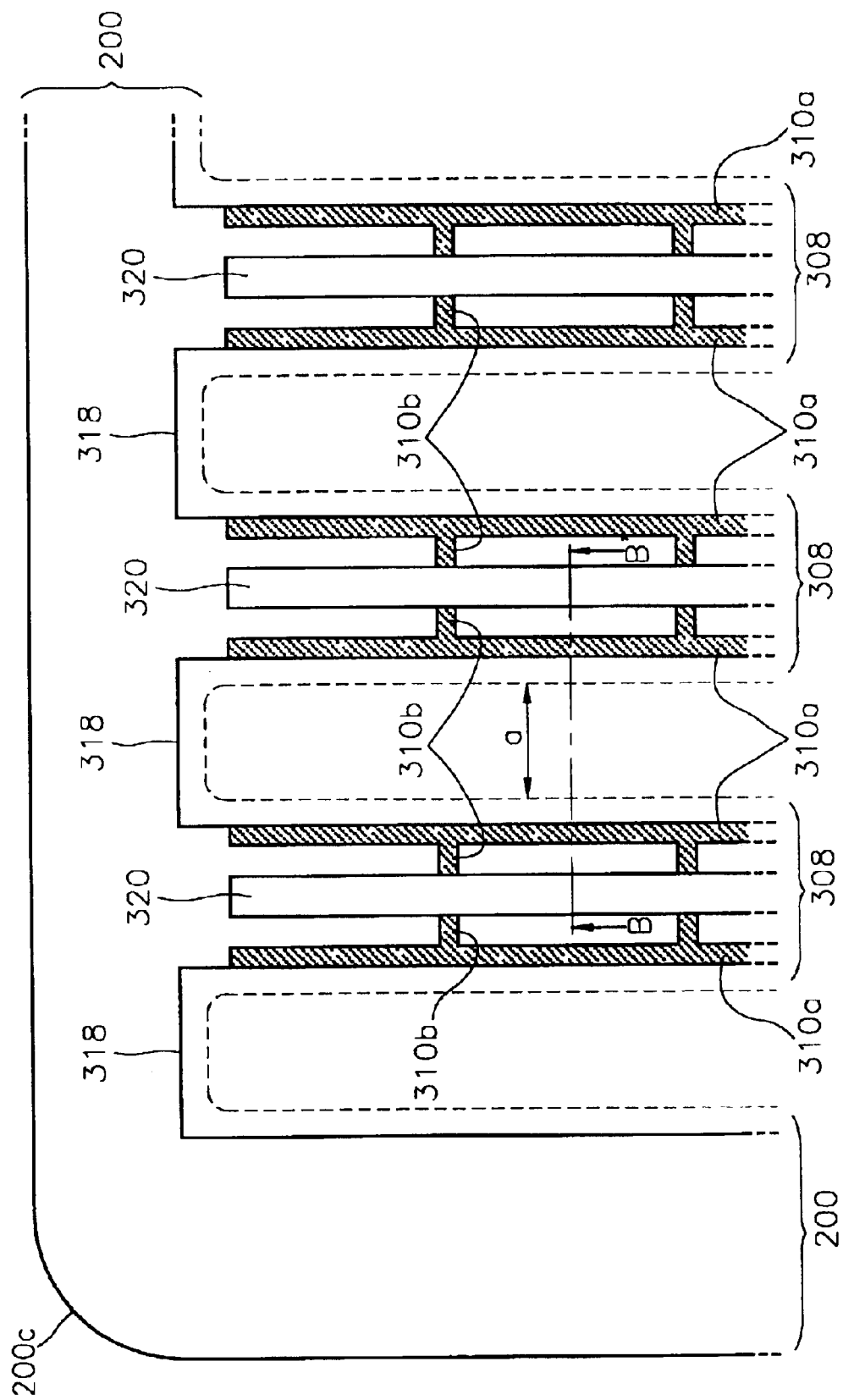
FIG. 3 is a layout view of a power MOS field effect transistor according to an embodiment of the present invention.
Figure 4:
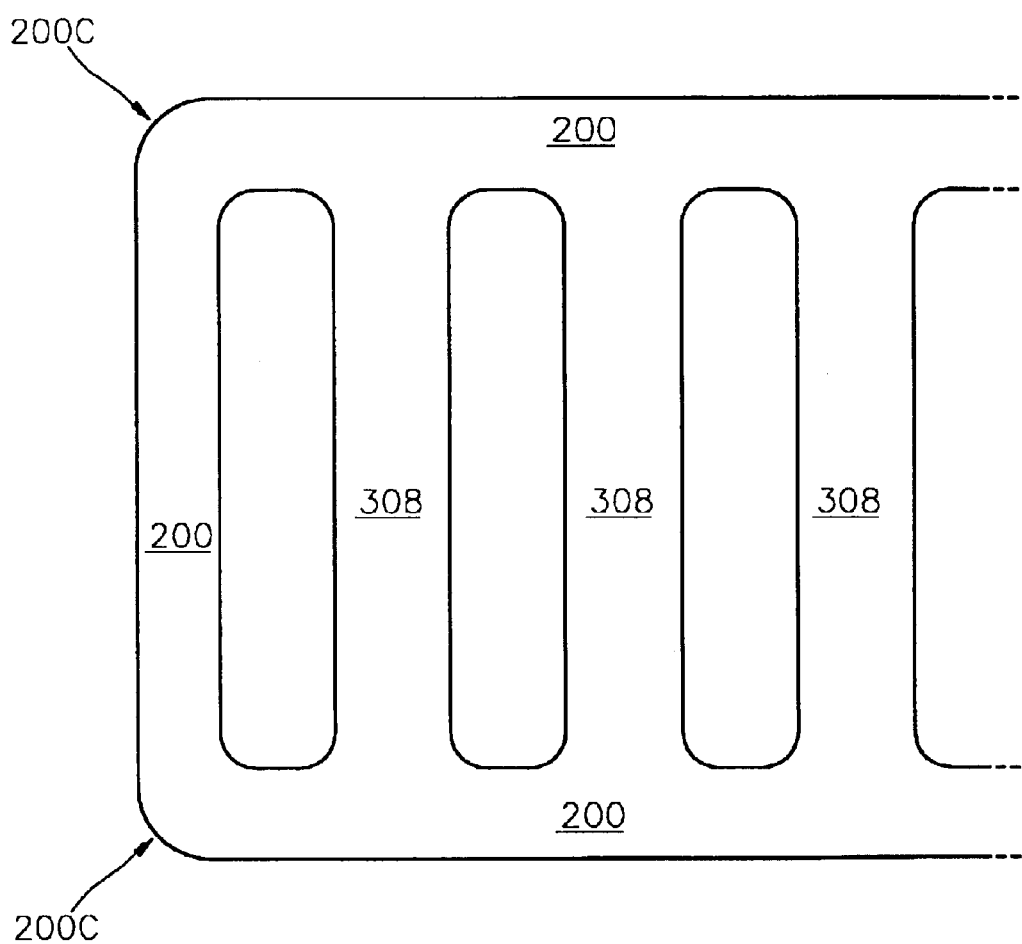
FIG. 4 is a layout view showing only the frame region and body regions of the FIG. 3 layout view.

In FIGS. 3 through 6B, like reference numerals are used to refer to like regions, layers, or portions. FIG. 3 is a layout view of a power MOS field effect transistor according to an embodiment of the present invention, and FIG. 4 is a layout view showing only the frame region and body regions of the FIG. 3 layout view.

Figure 1:
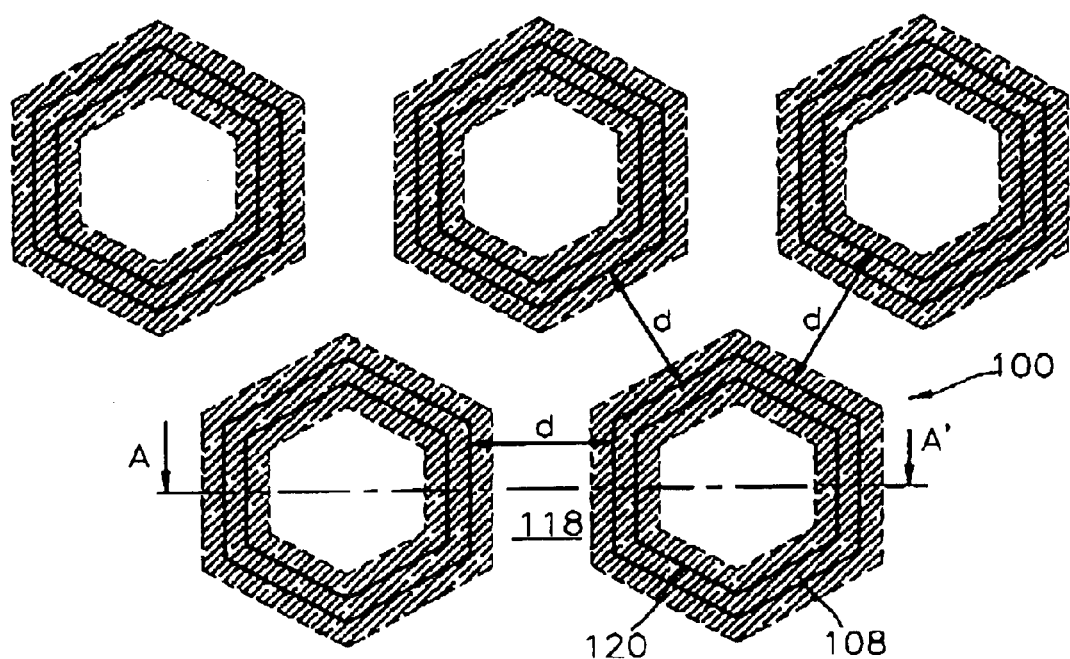
FIG. 1 is a layout view of a conventional power MOS field effect transistor.
Figure 2:
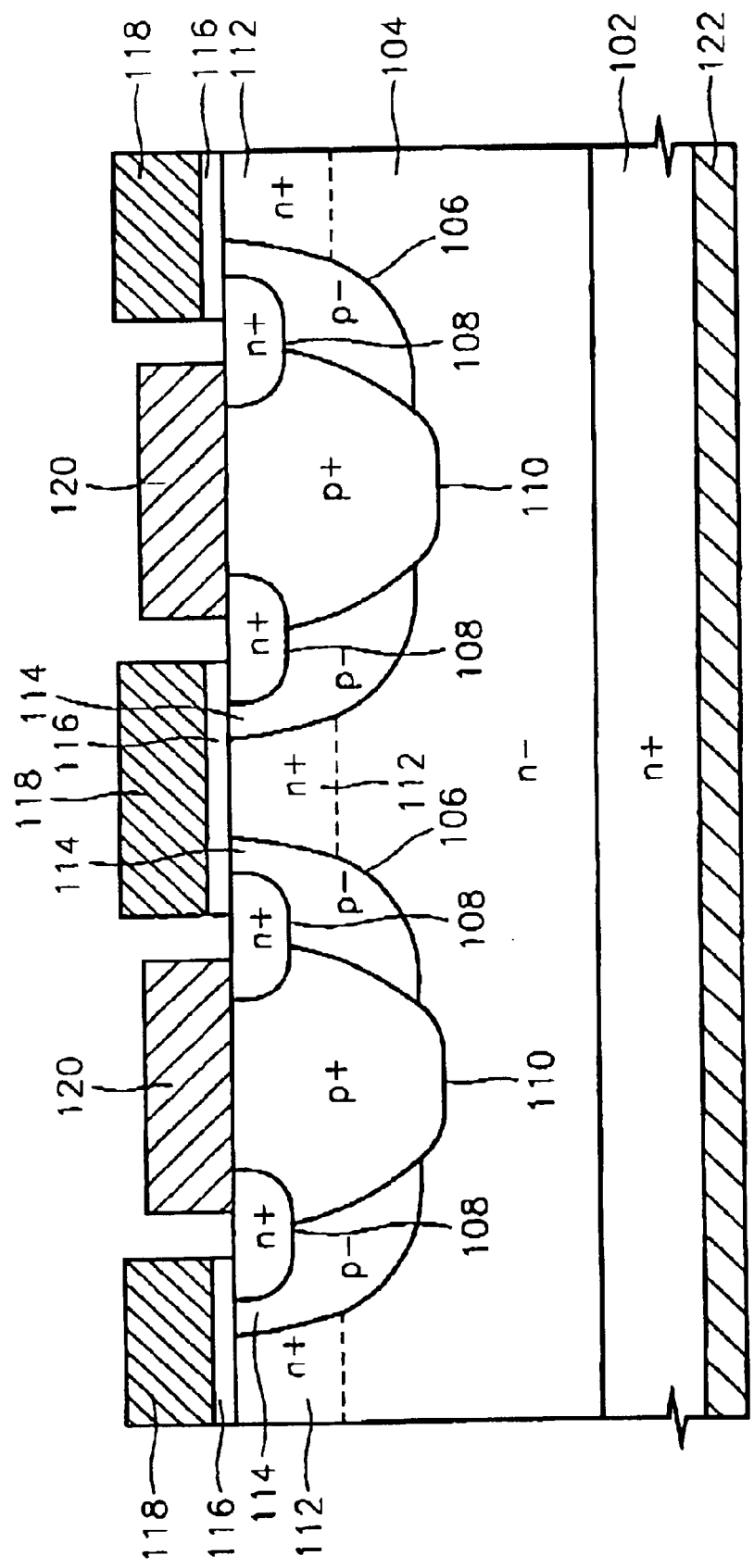
FIG. 2 is a sectional view taken along line A–A' in FIG. 1.

In FIGS. 3 and 4, a plurality of stripe-shaped cells are surrounded by a frame region 200. An upper portion and a lower portion of frame region 200 are vertically connected to each other by body regions 308. That is, an upper end of the body region 308 is connected to the upper portion of the frame region 200, and a lower end of the body region 308 is connected to the lower portion of the frame region 200. Body regions 308 and frame region 200 are of the same conductivity type. By forming body regions 308 in stripes and terminating them in frame region 200, an electric field is prevented from being concentrated at the two ends of each body region 308, and thus the breakdown voltage of the device is improved. For the reasons stated above in connection with FIGS. 1–2 and more fully explained further below, it is desirable that a spacing a between adjacent body regions 308 be made as small as possible. Further, in one embodiment, each corner 200c of frame region 200 has a radius of curvature that is greater than a predetermined value, e.g., 100 $\mu$m, so that a spherical junction can be prevented from occurring.

In FIG. 3, gate electrodes 318 (e.g., from polysilicon) are arranged in stripes such that upper and lower ends of each gate electrode 318 terminate over frame region 200, and an outermost vertically extending side of the outermost gate electrodes 318 also terminates over frame region 200. Source electrodes 320 (e.g., from metal) are arranged in stripes between adjacent gate electrodes 318. Each source region includes a vertically extending stripe portion 310a and short horizontally extending portions 310b. The short horizontally extending portions 310b electrically contact source electrodes 320.

Figure 5:
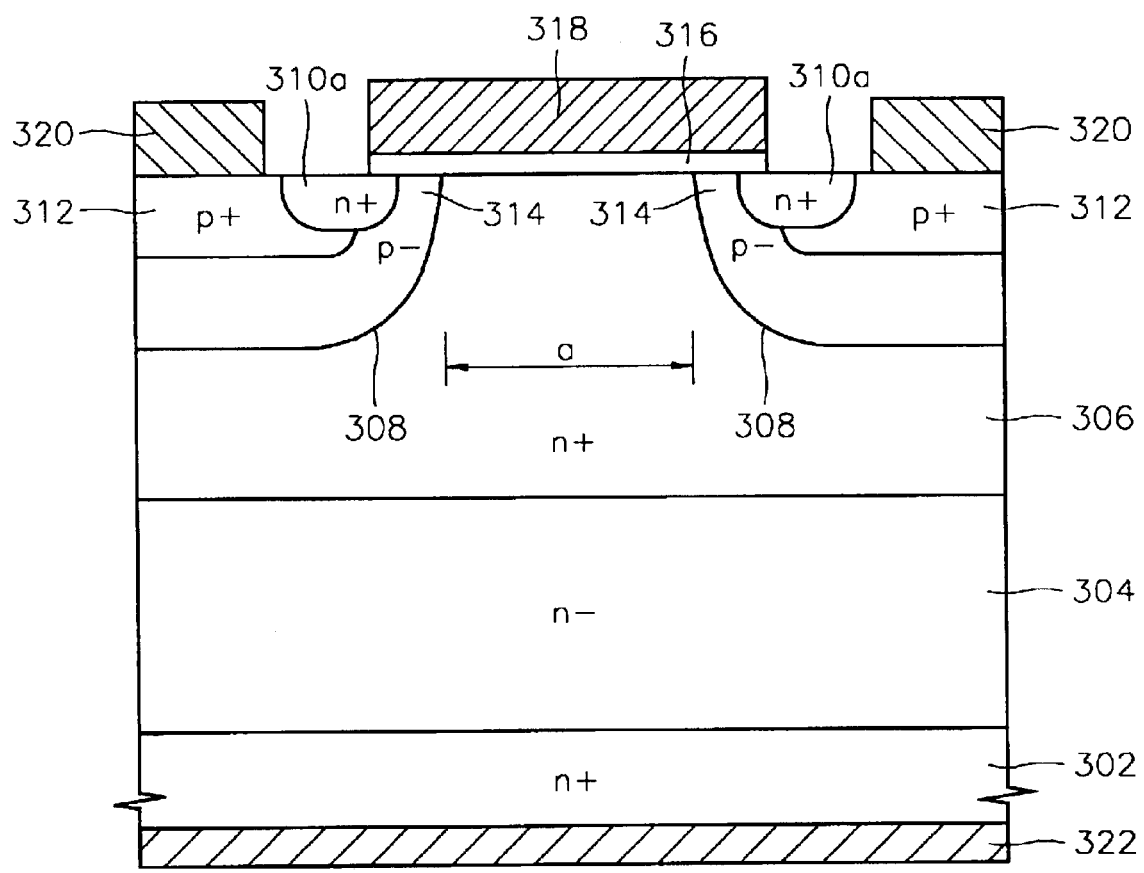
FIG. 5 is a sectional view taken along line B–B' in FIG. 3.

FIG. 5 is a sectional view along line B–B' in FIG. 3. A drift region 304 of $n^-$-type conductivity extends over an $n^+$-type semiconductor substrate 302 which serves as the drain contact region. An additional drift region 306 of $n^+$-type conductivity is formed on $n^-$-type drift region 304. Drift regions 804 and 806 may be epitaxially formed using conventional methods. Alternatively, only one epitaxially-formed drift region of $n^-$-type conductivity may be formed over substrate 302, and then the $n^+$-type region 306 is formed in an upper portion of the epitaxially-formed $n^-$-type drift region using conventional ion implantation methods. In one embodiment, a concentration of impurities in $n^+$-type drift region 306 is graded and becomes smaller toward the interface between $n^+$-type drift region 306 and $n^-$-type drift region 304. Body regions 308 of $p^-$-type conductivity are formed in an upper portion of $n^+$-type drift region 306. Source region portions 310a (corresponding to the vertically extending stripe portions 310a in FIG. 3) are formed in an upper portion of $p^-$-type body regions 308. A highly doped region 312 of $p^+$-type conductivity is formed in an upper portion of each of $p^-$-type body regions 308.

Gate insulating layers 316 overlap source region potions 310a, and extend over channel regions 314 in $p^-$-type body regions 308 and over $n^+$-type drift regions 306 between adjacent $p^-$-type body regions 308. Gate insulating layer may be from oxide formed using conventional methods. Gate electrode 318 extends over gate insulating layer 316. Source electrodes 320 electrically contact highly-doped ($p^+$) regions 312, but do not directly contact $n^+$-type source region portions 310a. However, source electrodes 320 electrically contact $n^+$-type source region portions 310a through $n^+$-type source region portions 310b (FIG. 3). A drain electrode 322 electrically contacts $n^+$-type drain region 302. The source and drain electrodes may be from metal, and are formed using conventional methods. Also, conventional ion implantation methods may be used to form body regions 308, highly-doped ($p^+$) regions 312, and source region portions 310a, 310b.

By using the n⁺-type drift region 306 which has a higher doping concentration than its underlying n⁻-type drift region 304, a lower on-resistance is obtained. This enables the width of the JFET region (i.e., the portion of n⁺-type drift region 306 between adjacent p⁻-type body regions 308), marked in FIGS. 3 and 5 by letter a, to be reduced. The reduction in the width of the JFET region results in a reduction in the area where gate electrode 318 extends over n⁺-type drift region 306. The reduction in the area in turn reduces the gate to source capacitance (Cgd) which helps improve the switching speed of the device. The reduction in the width of the JFET region also helps improve the device breakdown voltage as described next with reference to FIGS. 6A and 6B.

Figure 6B:
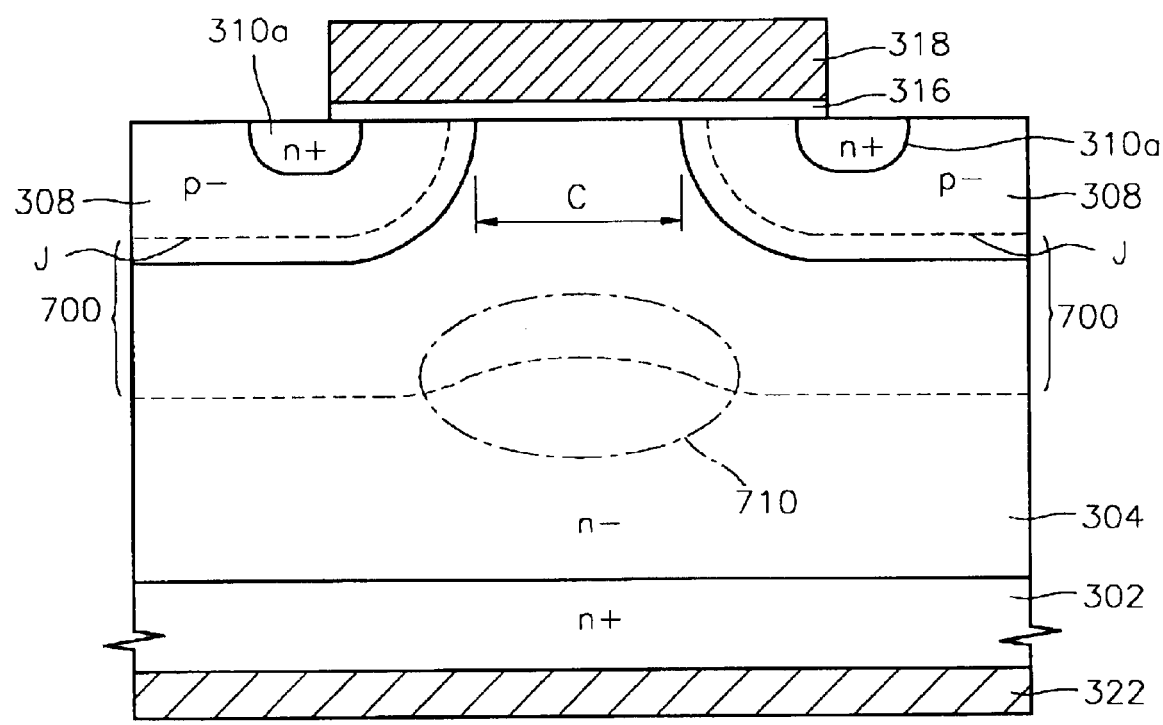
FIG. 6B is a sectional view of a power MOS field effect transistor where a distance between adjacent body regions is relatively small.

FIG. 6A is a sectional view of a power MOSFET where a width b of the JFET region (i.e., the region between adjacent body regions 308) is relatively large. FIG. 6B is a sectional view of a power MOSFET where a width c of the JFET region is relatively small. FIGS. 6A and 6B respectively show depletion regions 600 and 700 formed as a result of a reverse bias being applied across junction J formed between drift region 304 and body regions 308. In FIG. 6A, because of the relatively large width of the JFET region, the depletion region boundary in drift region 304 has a curvature at the rounded corners of junction J as shown in encircled area 610. Because of the curvature of the depletion region boundary, the electric field lines in these areas become crowded (as shown by the arrows in FIG. 6A). This results in a local increase in electric field which in turn causes a reduction in the breakdown voltage of the device.

In contrast, in FIG. 6B, because the width of the JFET region is relatively small, the boundary of depletion region 700 in drift region 304 is only slightly curved as shown in encircled area 710. Thus, depletion region 700 boundary in drift region 304 has a substantially flat contour. This results in a more uniform electric field distribution in the drift region which in turn results in higher breakdown voltage.

Therefore, in FIG. 5, a higher breakdown voltage, faster switching speed, and lower $R_{DSon}$ can be obtained by appropriately setting the width of the JFET region such that the depletion region boundary in the drift region has a substantially flat contour.

Figure 7:
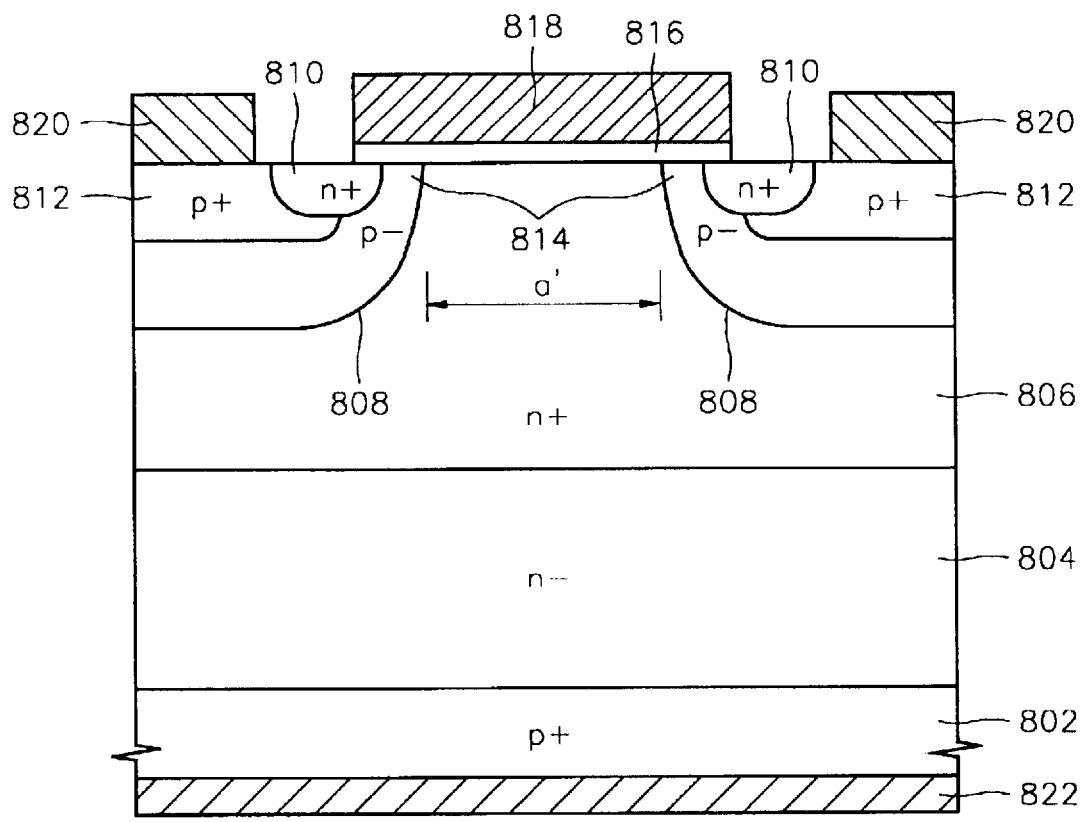
FIG. 7 is a sectional view of a power semiconductor device according to another embodiment of the present invention.

FIG. 7 is a sectional view of an insulating gate bipolar transistor (IGBT) according to an embodiment of the present invention. The IGBT in FIG. 7 has a similar layout as the power MOS field effect transistor in FIG. 3. A drift region 804 of n⁻-type conductivity extends over a p⁺-type semiconductor substrate 802 which serves as the collector contact region. A drift region 806 of n⁺-type conductivity type extends over n⁻-type drift region 804. In one embodiment, a concentration of impurities in n⁺-type drift region 806 is graded and becomes smaller toward the interface between n⁺-type drift region 806 and n⁻-type drift region 804. Base regions 808 of p⁻-type conductivity are formed in an upper portion of n⁺-type drift region 806. Emitter regions 810 of n⁺-type conductivity are formed in an upper portion of p⁻-type base regions 808. Similar to the source regions in FIG. 5, emitter regions 810 include laterally extending portions (no shown in FIG. 7) for contacting emitter electrodes 820. Highly doped regions 812 of p⁺-type conductivity are formed in an upper portion of p⁻-type base regions 808. Gate insulating layers 816 overlap source regions 810, and extend over the channel regions in p⁻-type body regions 308 and over portions of n⁺-type drift regions 806 between adjacent p-type body regions 308. Gate electrodes 818 extend over gate insulating layers 816. Emitter electrodes 820 electrically contact highly doped (p⁺) regions 812, and through laterally extending emitter region portions (not shown) contact emitter regions 810. A collector electrode 822 electrically contacts p⁺-type collector region 802.

Similar to the MOSFET in FIG. 5, the IGBT in FIG. 7 has low on-resistance because of the n⁺-type drift region 806 which has a higher doping concentration than its underlying n⁻-type drift region 804. This enables the width of the JFET region (i.e., the portion of n⁺-type drift region 806 between adjacent p⁻-type body regions 808), marked in FIG. 7 by letter a', to be reduced. The reduction in the width of the JFET region results in a reduction in the area where gate electrode 818 extends over n⁺-type drift region 806. The reduction in the area in turn reduces the gate to emitter capacitance which helps improve the switching speed of the device. The reduction in the width of the JFET region also helps improve the device breakdown voltage because of the substantially flat contour of the depletion region boundary in the drift region.

As described above, by forming the body regions in stripes and terminating them in the frame region, an electric field is prevented from being concentrated at the two ends of each body region 308, and thus the breakdown voltage of the device is improved. In addition, the switching speed and the breakdown voltage are further improved by reducing the width of the JFET region (i.e., the portions of the drift region between body regions) so that the depletion region boundary in the drift region is substantially flat. Moreover, the on-resistance of the power semiconductor device is reduced by forming a drift region having a high concentration of impurities on another drift region having a lower concentration of impurities.

Although the invention has been described in the context of power MOSFET and IGBT devices, forming other types of power devices (for example, a p-channel MOSFET) to obtain the benefits of the present invention would be obvious to one skilled in this art in view of the above teachings.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A power semiconductor device comprising:
   a semiconductor substrate;
   a first drift region of a first conductivity type extending over the semiconductor substrate, the first drift region having a lower impurity concentration than the semiconductor substrate;
   a second drift region of a the first conductivity type extending over the first drift region, the second drift region having a higher impurity concentration than the first drift region;
   a plurality of stripe-shaped body regions of a second conductivity type formed in an upper portion of the second drift region;
   a third region of the first conductivity type formed in an upper portion of each body region so as to form a channel region in each body region between the third region and the second drift region; and
   a gate electrode laterally extending over but being insulated from: (i) the channel region in each body region, (ii) a surface area of the second drift region between adjacent stripes of body regions, and (iii) a surface portion of each third region wherein adjacent stripes of body regions are spaced apart from one another by a predetermined distance such that when a reverse bias is applied across the junction formed between each body region and the second drift region a resulting depletion region has a substantially flat boundary in the second drift region.

2. The power semiconductor device of claim 1 further comprising a frame region surrounding the plurality of stripe-shaped body regions such that upper and lower portions of each body region are terminated in the frame region, the frame region having the same conductivity type as the body regions.

3. The power semiconductor device of claim 1 wherein the second drift region has a graded impurity concentration which reduces toward an interface between the first and second drift regions.

4. The power semiconductor device of claim 1 wherein the first conductivity type is n-type and the second conductivity type is p-type.

5. The power semiconductor device of claim 1 wherein the power semiconductor device is a MOSFET, the semiconductor substrate is of the first conductivity type and forms MOSFET's drain contact region, and the third region forms MOSFET's source region.

6. The power semiconductor device of claim 1 wherein the power semiconductor device is an IGBT, the semiconductor substrate is of the second conductivity type and forms IGBT's collector contact region, and the third region forms IGBT's emitter region.

7. The power semiconductor device of claim 1 wherein the gate electrode is stripe-shaped and extends parallel to the plurality of stripe-shaped body regions.

8. The power semiconductor device of claim 1 further comprising:
   a highly doped region of the second conductivity type formed in an upper portion of each body region;
   a first metal electrode having a stripe shape, configured to contact the third region and the highly doped region in each body region; and
   a second metal electrode configured to contact the semiconductor substrate.

9. The power semiconductor device of claim 1 wherein each third region comprises:
   a stripe-shaped portion extending parallel to the plurality of stripe-shaped body regions; and
   a plurality of laterally extending portions configured to contact a metal electrode.

10. A power semiconductor device comprising:
   a semiconductor substrate;
   a first drift region of a first conductivity type extending over the semiconductor substrate, the first drift region having a lower impurity concentration than the semiconductor substrate;
   a second drift region of a the first conductivity type extending over the first drift region, the second drift region having a higher impurity concentration than the first drift region;
   a plurality of stripe-shaped body regions of a second conductivity type formed in an upper portion of the second drift region;
   a third region of the first conductivity type formed in an upper portion of each body region so as to form a channel region in-each body region between the third region and the second drift region;
   a stripe-shaped gate electrode laterally extending over but being insulated from: (i) the channel region in each body region, (ii) a surface area of the second drift region between adjacent stripes of body regions, and (iii) a surface portion of each source region;
   a highly doped region of the second conductivity type formed in an upper portion of each body region;
   a first metal electrode configured to contact the third region and the highly doped region in each body region; and
   a second metal electrode configured to contact the semiconductor substrate,
   wherein adjacent stripes of body regions are spaced apart from one another by a predetermined distance such that when a reverse bias is applied across the junction formed between each body region and the second drift region a resulting depletion region has a substantially flat boundary in the second drift region.

11. The power semiconductor device of claim 10 further comprising a frame region surrounding the plurality of stripe-shaped body regions such that upper and lower portions of each body region are terminated in the frame region, the frame region having the same conductivity type as the body regions.

12. The power semiconductor device of claim 10 wherein the second drift region has a graded impurity concentration which reduces toward an interface between the first and second drift regions.

13. The power semiconductor device of claim 10 wherein the first conductivity type is n-type and the second conductivity type is p-type.

14. The power semiconductor device of claim 10 wherein the power semiconductor device is a MOSFET, the semiconductor substrate is of the first conductivity type and forms MOSFET's drain contact region, and the third region forms MOSFET's source region.

15. The power semiconductor device of claim 10 wherein the power semiconductor device is an IGBT, the semiconductor substrate is of the second conductivity type and forms IGBT's collector contact region, and the third region forms IGBT's emitter region.

16. The power semiconductor device of claim 10 wherein each third region comprises:
   a stripe-shaped portion extending parallel to the plurality of stripe-shaped body regions; and
   a plurality of laterally extending portions configured to contact a metal electrode.

* * * * *